United States Patent
Hu et al.

(10) Patent No.: US 10,319,894 B2
(45) Date of Patent: Jun. 11, 2019

(54) WEARABLE ELECTRONIC DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Lingxiao Hu, Beijing (CN); Wenhao Zhang, Beijing (CN); Youhui Liu, Beijing (CN)

(73) Assignees: BOE TECHNOLOGY GROUP CO., LTD., Beijing (CN); HEFEI BOE OPTOELECTRONCIS TECHNOLOGY CO., LTD., Hefei, Anhui (CN)

( * ) Notice: Subject to any disclaimer, the term of this patent is extended or adjusted under 35 U.S.C. 154(b) by 518 days.

(21) Appl. No.: 15/025,395

(22) PCT Filed: Nov. 2, 2015

(86) PCT No.: PCT/CN2015/093599
§ 371 (c)(1),
(2) Date: Mar. 28, 2016

(87) PCT Pub. No.: WO2016/184041
PCT Pub. Date: Nov. 24, 2016

(65) Prior Publication Data
US 2017/0162773 A1 Jun. 8, 2017

(30) Foreign Application Priority Data
May 15, 2015 (CN) .......................... 2015 1 0249297

(51) Int. Cl.
*H01L 35/30* (2006.01)
*H01L 35/02* (2006.01)
(Continued)

(52) U.S. Cl.
CPC ............. *H01L 35/02* (2013.01); *G04G 21/00* (2013.01); *G06F 1/163* (2013.01); *G06F 1/1635* (2013.01);
(Continued)

(58) Field of Classification Search
CPC ....... H01L 35/02; H01L 35/32; G06F 1/1635; G06F 1/163
See application file for complete search history.

(56) References Cited

U.S. PATENT DOCUMENTS

2001/0017151 A1* 8/2001 Tauchi .................... H01L 35/08
136/200
2009/0069045 A1* 3/2009 Cheng .................. H02J 7/0042
455/556.1

(Continued)

FOREIGN PATENT DOCUMENTS

CN 1266508 A 9/2000
CN 1509516 A 6/2004
(Continued)

OTHER PUBLICATIONS

First Chinese Office Action dated Nov. 11, 2016; Appln. No. 201510249297.X.
(Continued)

*Primary Examiner* — Angelo Trivisonno
(74) *Attorney, Agent, or Firm* — Ladas & Parry LLP

(57) ABSTRACT

A wearable electronic device including a display portion and a fixed portion connected with the display portion. The fixed portion is configured to fix the wearable electronic device on body of a wearer. The display portion includes a display screen. The fixed portion is provided with a thermoelectric conversion module which is insulated and isolated from external environment. The thermoelectric conversion module is configured to convert a temperature difference
(Continued)

between a body temperature of the wearer and a temperature of the external environment into electrical energy used for operating the wearable electronic device. The wearable electronic device has enhanced endurance.

18 Claims, 2 Drawing Sheets

(51) Int. Cl.
*H02J 7/32* (2006.01)
*G06F 1/16* (2006.01)
*H01L 35/16* (2006.01)
*H01L 35/32* (2006.01)
*G04G 21/00* (2010.01)
*G06F 1/26* (2006.01)

(52) U.S. Cl.
CPC ............... *G06F 1/26* (2013.01); *H01L 35/16* (2013.01); *H01L 35/32* (2013.01); *H02J 7/32* (2013.01); *G06F 1/1637* (2013.01); *Y02B 40/90* (2013.01)

(56) References Cited

U.S. PATENT DOCUMENTS

| | | | | |
|---|---|---|---|---|
| 2014/0326287 A1* | 11/2014 | Wiant | ................... | H01L 35/32 |
| | | | | 136/205 |
| 2016/0336501 A1* | 11/2016 | Kasichainula | .......... | H01L 35/32 |

FOREIGN PATENT DOCUMENTS

| | | |
|---|---|---|
| CN | 101650547 A | 2/2010 |
| CN | 201408783 Y | 2/2010 |
| CN | 101711436 A | 5/2010 |
| CN | 103346702 A | 10/2013 |
| CN | 203278909 U | 11/2013 |
| CN | 203387438 U | 1/2014 |
| CN | 103750604 A | 4/2014 |
| CN | 203555262 U | 4/2014 |
| CN | 104273810 A | 1/2015 |
| CN | 104377399 A | 2/2015 |
| CN | 204304532 U | 4/2015 |
| JP | 2005-136240 A | 5/2005 |

OTHER PUBLICATIONS

The Second Chinese Office Action dated Jun. 2, 2017; Appln. No. 201510249297.X.
International Search Report and Written Opinion both dated Jan. 21, 2016; PCT/CN2015/093599.

* cited by examiner

WEARABLE ELECTRONIC DEVICE

TECHNICAL FIELD

Embodiments of the present disclosure relates to a wearable electronic device.

BACKGROUND

Currently, types of electronic devices in market for a consumer to choose are increasing day by day. For example, electronic devices for communication, such as cell phones, and tablets or the like. To satisfy the demand of the consumer for miniaturization of electronic device, wearable electronic devices (such as, smart watches) have been developed.

A battery with high-capacity could not be installed in the wearable electronic device due to its small volume. As a result, endurance of the wearable electronic device is bad, and the wearable electronic device needs to be charged frequently.

How to improve endurance of the wearable electronic device is an urgent problem to be solved in the art.

SUMMARY

Embodiments of the present disclosure provide a wearable electronic device, including: a display portion; a fixed portion connected with the display portion. The fixed portion is configured to fix the wearable electronic device on body of a wearer. The display portion includes a display screen. The fixed portion is provided with a thermoelectric conversion module which is insulated and isolated from external environment. The thermoelectric conversion module is configured to convert a temperature difference between a body temperature of the wearer and a temperature of the external environment into electrical energy for operation of the wearable electronic device.

In an example, the display portion further includes an accumulator, an input end of the accumulator is connected with an output end of the thermoelectric conversion module to store the electrical energy generated by the thermoelectric conversion module, and an output end of the accumulator is connected with a power input end of the display screen.

In an example, the thermoelectric conversion module includes a plurality of thermoelectric conversion sub-modules connected with each other in series.

In an example, a part of the plurality of thermoelectric conversion sub-modules uses the body of the wearer as a heat source and uses the external environment in which the thermoelectric conversion sub-modules are located as a cold source; and other parts of the thermoelectric conversion sub-modules use the external environment in which the thermoelectric conversion sub-modules are located as a heat source and use the body of the wearer as a cold source.

In an example, a surface of each thermoelectric conversion sub-module using the external environment as the heat source facing the external environment is provided with a layer of heat-absorption material; and/or a surface of each thermoelectric conversion sub-module using the body of the wearer as a heat source contacting the body of the wearer is provided with a layer of heat-absorption material.

In an example, wherein the display portion and the fixed portion form a closed ring.

In an example, the fixed portion includes a plurality of fixed blocks, adjacent fixed blocks of the plurality of fixed blocks are hinged with each other, and each of the plurality of fixed blocks is provided with one of the thermoelectric conversion sub-modules.

In an example, each of the thermoelectric conversion sub-modules includes at least one thermoelectric conversion unit. The thermoelectric conversion unit includes a P-type semiconductor, an N-type semiconductor, a first plate electrode, and two second plate electrodes. The first plate electrode is positioned on a side of the thermoelectric conversion unit, and both the P-type semiconductor and the N-type semiconductor are fixed on the first plate electrode. One of the two second plate electrodes is positioned on an end of the P-type semiconductor away from the first plate electrode, and the other one of the two second plate electrodes is positioned on an end of the N-type semiconductor away from the first plate electrode. Both the P-type semiconductor and the N-type semiconductor are made of thermoelectric material, and the P-type semiconductor and the N-type semiconductor have different Seebeck coefficients.

In an example, each of the fixed blocks includes a first heat-conducting plate and a second heat-conducting plate, both the first heat-conducting plate and the second heat-conducting plate are insulated. The first plate electrode is fixed on the first heat-conducting plate, and the second plate electrode is fixed on the second heat-conducting plate.

In an example, both the first heat-conducting plate and/or the second heat-conducting plate are made of ceramic material.

In an example, the P-type semiconductor includes P-doped $Bi_2Te_3$, and the N-type semiconductor includes N-doped $Bi_2Te_3$.

In an example, the P-type semiconductor is doped with Sb and the N-type semiconductor is doped with Se.

In an example, a plurality of the thermoelectric conversion units are included on a same one of the plurality of fixed blocks. The N-type semiconductor of one of the thermoelectric conversion units is adjacent to the P-type semiconductor of another thermoelectric conversion unit adjacent to the one; and second plate electrodes of the two adjacent thermoelectric conversion units are integrated together.

In an example, each of the thermoelectric conversion sub-modules includes a leading-out end and a leading-in end; the leading-out end is connected with the second plate electrode of the P-type semiconductor on an end of the thermoelectric conversion module, and the leading-in end is connected with the second plate electrode of the N-type semiconductor on the other end of the thermoelectric conversion module. A current flows into the thermoelectric conversion sub-module at the leading-in end, and flows out at the leading-out end.

In an example, in the fixed portion, in two adjacent fixed blocks, a second plate electrode corresponding to the leading-out end of a thermoelectric conversion sub-module in one of the two adjacent fixed blocks is disposed on one of the first heat-conducting plate and the second heat-conducting plate which is configured to contact the body of the wearer, and a second plate electrode corresponding to the leading-in end of a thermoelectric conversion sub-module in the other one of the two adjacent fixed blocks is disposed on one of the first heat-conducting plate and the second heat-conducting plate which is configured to contact the external environment; or all second plate electrodes corresponding to leading-out ends of the thermoelectric conversion sub-modules are disposed on one of the first heat-conducting plate and the second heat-conducting plate which is configured to contact the body of the wearer; or all second plate electrodes corresponding to leading-out ends of the thermoelectric conversion sub-modules are disposed on one of the first heat-conducting plate and the second heat-conducting plate which is configured to contact the external environment; or the fixed portion is divided into two parts: in one part of the fixed portion, a second plate electrode corresponding to a leading-in end of each of the thermoelectric conversion sub-modules is disposed on one of the first heat-conducting plate and the second heat-conducting plate which is configured to contact the body of the wearer, while in the other part of the fixed portion, a second plate electrode corresponding to a leading-in end of each of the thermoelectric conversion sub-modules is disposed on one of the first heat-conducting plate and the second heat-conducting plate which is configured to contact the external environment.

In an example, the output end of the thermoelectric conversion module includes a positive pole terminal connected with the P-type semiconductor located at an end of the fixed portion which is connected with the display portion, and a negative pole terminal connected with the N-type semiconductor located at the end of the fixed portion which is connected with the display portion.

In an example, the second plate electrode of one end of each of the thermoelectric conversion sub-modules is an input end of the thermoelectric conversion sub-module, and the second plate electrode of the other end of each of the thermoelectric conversion sub-modules is an output end of the thermoelectric conversion sub-module; or the fixed portion is divided into two parts: in one part of the fixed portion, a first plate electrode of one end of each of the thermoelectric conversion sub-modules is an input end of the thermoelectric conversion sub-module, and the first plate electrode of the other end of each of the thermoelectric conversion sub-modules is an output end of the thermoelectric conversion sub-module; while in the other part of the fixed portion, a second plate electrode of one end of each of the thermoelectric conversion sub-modules is an input end of the thermoelectric conversion sub-module, and the second plate electrode of the other end of each of the thermoelectric conversion sub-modules is an output end of the thermoelectric conversion sub-module.

In an example, each of the fixed blocks includes a heat-conducting protective layer; the heat conducting protective layer is disposed on a surface of the first heat-conducting plate facing away from the second heat-conducting plate, and/or the heat conducting protective layer is disposed on a surface of the second heat-conducting plate facing away from the first heat-conducting plate.

In an example, both the first heat-conducting plate and the second heat-conducting plate are provided with the heat-conducting protective layer; in two adjacent ones of the fixed blocks, the heat-conducting protective layers disposed on the first heat-conducting plates are hinged with each other, and/or in two adjacent ones of the fixed blocks, the heat-conducting protective layers disposed on the second heat-conducting plates are hinged with each other.

BRIEF DESCRIPTION OF THE DRAWINGS

The accompanying drawings are for providing a better understanding of the present disclosure and constitute a part of this specification, and with the detailed description, they are intended to explain the present disclosure, but not to limit the present disclosure, in which.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," "left," "right" or the like are only used to indicate relative position relationship, and when the position of the object which is described is changed, the relative position relationship may be changed accordingly.

Detailed description of particular embodiments of the present disclosure will be provided below in conjunction with the accompanying drawings. It is understood that the particular embodiments described herein is used to illustrate and explain the present disclosure, and not to limit the present disclosure.

Figure 1:
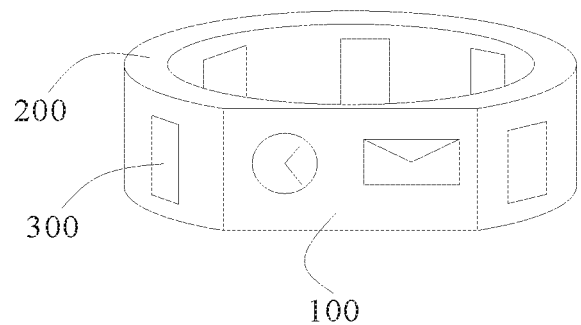
FIG. 1 is a schematic diagram illustrates a wearing state of a wearable electronic device provided in an embodiment of the present disclosure.
Figure 2:
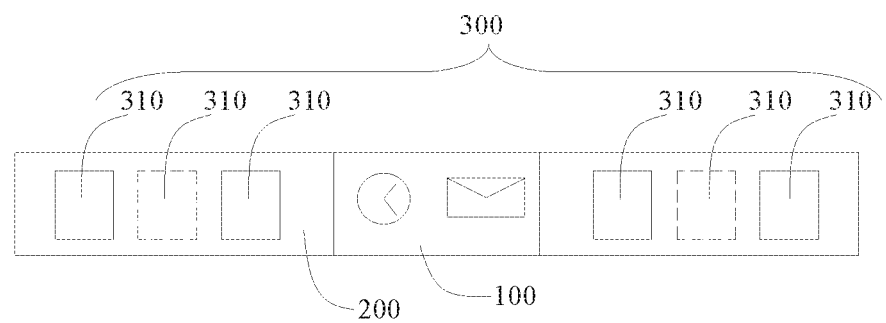
FIG. 2 is a schematic diagram illustrates a flattened state of the wearable electronic device as shown in FIG. 1.

As shown in FIG. 1 and FIG. 2, a wearable electronic device is provided in the present disclosure. The wearable electronic device includes a display portion 100 and a fixed portion 200 connected with the display portion 100. The fixed portion 200 is configured to fix the wearable electronic device on body of a wearer. The display portion 100 includes a display screen 110. The fixed portion 200 is provided with a thermoelectric conversion module 300 which is insulated and isolated from external environment. The thermoelectric conversion module 300 is configured to convert a temperature difference between a body temperature of the wearer and a temperature of the external environment into electrical energy used for operating the wearable electronic device.

The configuration of thermoelectric conversion module 300 being insulated and isolated from the external environment may prevent the thermoelectric conversion module 300 from electric leakage when it is at work.

The thermoelectric conversion module 300 may generate electrical energy due to the temperature difference between the body temperature of the wearer and the temperature of the external environment. The electrical energy may be used to drive the display portion 100 to display. As a result, when being used, the wearable electronic device provided by the present disclosure need not to be charged by an external power source. Endurance of the wearable electronic device is improved.

When the wearable electronic device is worn by a wearer, a side surface of its fixed portion is contacted with the body of the wearer, while the other side surface is exposed to the external environment. The "temperature difference" herein is generated from the temperature difference between the body temperature of the wearer and the environment temperature. The thermoelectric conversion module 300 may take full use of the environment temperature. Therefore, costs for using the wearable electronic device may be reduced and energy resources may then be saved.

In order to take full use of the electrical energy generated by the thermoelectric conversion module 300, for example, the display portion 100 may further include an accumulator 120. An input end of the accumulator 120 may be connected with an output end of the thermoelectric conversion module 300, to store the electrical energy generated by the thermoelectric conversion module 300; and an output end of the accumulator 120 is connected with a power input end of the display screen 110.

The accumulator 120 may convert electrical energy into chemical energy, and may store the electrical energy generated by the thermoelectric conversion module 300.

The wearable electronic device may include a rectifying device instead of the accumulator. The rectifying device may convert current generated by the thermoelectric conversion module into steady current for operating the display portion.

To increase production of the electrical energy, for example, the thermoelectric conversion module 300 may include a plurality of thermoelectric conversion sub-modules 310. For example, the plurality of thermoelectric conversion sub-modules 310 may be connected with each other in series. Electrical energy generated by all thermoelectric conversion sub-modules 310 utilizing their own temperature differences may be delivered to the accumulator 120 for storage.

As an implementation of the present disclosure, a part of the plurality of thermoelectric conversion sub-modules 310 may use body of the wearer as a heat source and use the external environment in which the thermoelectric conversion sub-modules 310 are located as a cold source; and other parts of the plurality of thermoelectric conversion sub-modules 310 may use the external environment in which the thermoelectric conversion sub-modules are located as a heat source and use the body of the wearer as a cold source. The thermoelectric conversion sub-modules 310 using the body of the wearer as the heat source and using the external environment as the cold source may generate electrical energy, in case that the body temperature of the wearer is higher than the temperature of the external environment; and the thermoelectric conversion sub-modules 310 using the body of the wearer as the cold source and using the external environment as the heat source may generate electrical energy, in case that the body temperature of the wearer is lower than the temperature of the external environment. As shown in FIG. 2, the thermoelectric conversion sub-modules 310 illustrated as dashed boxes may use the body of the wearer as the heat source; and the thermoelectric conversion sub-modules 310 illustrated as solid line boxes may use the external environment as the heat source. Such configuration may allow the electrical energy to be generated at any temperature.

In FIG. 2, the thermoelectric conversion sub-modules 310 using the body of the wearer as the heat source and thermoelectric conversion sub-modules 310 using the external environment as the heat source may be arranged alternatively, however, the present disclosure is not limited thereto.

Arrangement modes of the thermoelectric conversion sub-modules will be described below in connection with exemplary implementations, which will not be described here.

Figure 6:
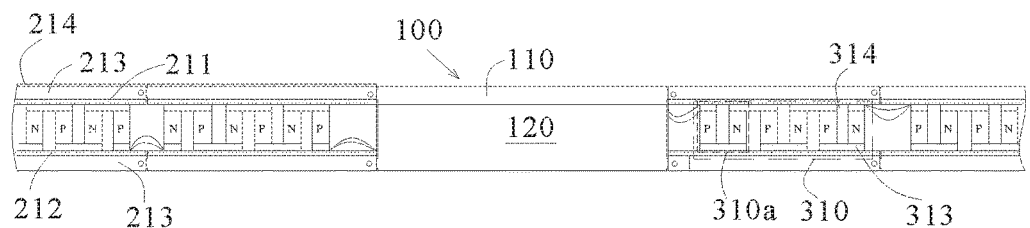
FIG. 6 is a schematic diagram illustrates a second implementation of the wearable electronic device provided in the present disclosure.

To ensure that the thermoelectric conversion sub-modules 310 using the external environment as the heat source sufficiently utilize heats in the external environment, for example, a surface of each thermoelectric conversion sub-module using the external environment as the heat source facing the external environment is provided with a layer of heat-absorption material 214 (as shown in FIG. 6). Alternatively, the layer of heat-absorption material may be disposed on a surface of each thermoelectric conversion sub-module using the body of the wearer as a heat source contacting the body of the wearer. Moreover, both the thermoelectric conversion sub-modules using the external environment as the heat source and the thermoelectric conversion sub-modules using the body of the wearer as the heat source may be provided with the layer of heat-absorption material. The layer of heat-absorption material has good heat conductivity and thus may absorb heats in an even better way. Specific heat of the layer of heat-absorption material is smaller than the specific heat of the material of which the fixed portion is made. As an implementation of the present disclosure, the material of the layer of heat-absorption material 214 may be a plating metal layer.

In the present disclosure, the wearable electronic device may be a smartwatch, however, the present disclosure is not limited thereto. As shown in FIG. 1, the display portion 100 may function as both a communication device and a time displaying device. In a case, as shown in FIG. 1, the display portion 100 and the fixed portion 200 may form a closed ring, such that the wearable electronic device may be fixed on a wrist.

In the present disclosure, the fixed portion 200 is shaped in a manner that the fixed portion 200 may carry the thermoelectric conversion module 300 and may form a closed ring with the display portion 100. In the present disclosure, for example, the fixed portion 200 may be formed as a chain. In such an implementation, the fixed portion 200 include a plurality of fixed blocks 210. Adjacent fixed blocks of the plurality of fixed blocks 210 may be hinged with each other. Correspondingly, each of the plurality of fixed blocks 210 may be provided with one of the thermoelectric conversion sub-modules 310.

In the present disclosure, for example, a cavity may be disposed in each of the fixed blocks 210. The thermoelectric conversion sub-modules 310 may then be disposed in the cavities, however, the present disclosure is not limited thereto. After the plurality of thermoelectric conversion sub-modules 310 are cascaded, electrical energy generated by each of the thermoelectric conversion sub-modules 310 may be delivered into the accumulator 120.

Figure 3:
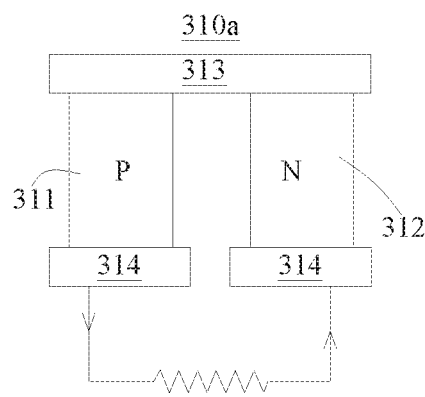
FIG. 3 is a schematic structural view of a thermoelectric conversion unit.

As an implementation of the present disclosure, as shown in FIG. 3, each of the thermoelectric conversion sub-modules 310 may include at least one thermoelectric conversion unit 310a. The thermoelectric conversion unit 310a may include a P-type semiconductor 311, an N-type semiconductor 312, a first plate electrode 313, and two second plate electrodes 314. The first plate electrode 313 may be disposed on a side of the thermoelectric conversion unit 310a. Both the P-type semiconductor 311 and the N-type semiconductor 312 may be fixed on the first plate electrode 313. One of the two second plate electrodes 314 may be positioned on an end of the P-type semiconductor 311 away from the first plate electrode 313 and the other one of the two second plate electrodes 314 may be positioned on an end of the N-type semiconductor 312 away from the first plate electrode 313. Both the P-type semiconductor 311 and the N-type semiconductor 312 may be made of thermoelectric material. The P-type semiconductor 311 and the N-type semiconductor 312 have different Seebeck coefficients.

According to the Seebeck effect, different metallic conductors (or semiconductors) have different densities of free electrons (or carrier densities). When two different metallic conductors (or semiconductors) contact with each other, electrons (or carriers) on the contact surface will diffuse from high concentration to low concentration. The diffusion rate of the electrons (or carriers) is proportional to the temperature of the contact zone. The electrons will keep on diffusing, as long as the temperature difference between the two metallic conductor (or semiconductor) elements is maintained. As a result, a stable voltage will be formed between the two ends of the two metallic conductors (or semiconductors), which do not contact with each other.

In the present disclosure, an end of the P-type semiconductor 311 and an end of the N-type semiconductor 312 may be contacted via the first plate electrode 313; and the other end of the P-type semiconductor 311 and the other end of the N-type semiconductor 312 may be contacted with two different second plate electrodes 314. Since the Seebeck coefficients of the P-type semiconductor 311 and the N-type semiconductor 312 are different, when there is a temperature difference between the first plate electrode 313 and the second plate electrodes 314, a current may be generated in the thermoelectric conversion unit 310a, and a potential difference may occur between the second plate electrode 314 connected with the P-type semiconductor 311 and the second plate electrode 314 connected with the N-type semiconductor 312. The second plate electrode 314 connected with the P-type semiconductor 311 may be formed as a positive pole, and the second plate electrode 314 connected with the N-type semiconductor 312 may be formed as a negative pole.

In the thermoelectric conversion unit 310a, typically, the first plate electrode 313 may adjoin the heat source and the second plate electrodes 314 may adjoin the cold source, leading to a temperature difference between the first plate electrode 313 and the second plate electrodes 314. As a result, a current may be generated.

For purpose of the insulation and isolation from the external environment of the thermoelectric conversion module 300, in the present disclosure, the first plate electrode 313 and the second plate electrodes 314 should be insulated and isolated from the external environment.

Figure 4:
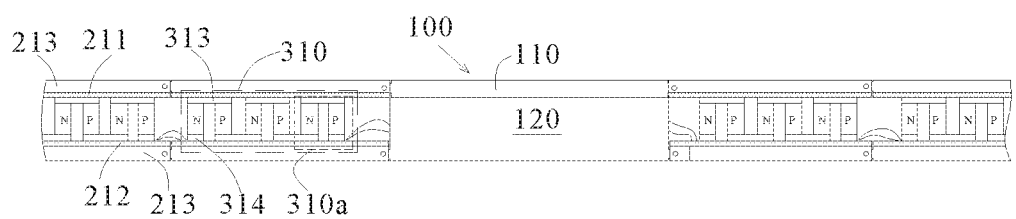
FIG. 4 is a schematic diagram illustrates a first implementation of the wearable electronic device provided in the present disclosure.

For convenience of collecting heats, for example, each of the fixed blocks 210 may include a first heat-conducting plate 211 and a second heat-conducting plate 212, both of which are insulated. As shown in FIG. 4 and FIG. 6, the first plate electrode 313 is fixed on the first heat-conducting plate 211, and the second plate electrodes 314 are fixed on the second heat-conducting plate 212.

To avoid damaging the heat-conducting plates, for example, each of the fixed blocks may include a heat-conducting protective layer 213. The heat conducting protective layer 213 may be disposed on a surface (i.e., the upper surfaces as shown in FIG. 4 and FIG. 6) of the first heat-conducting plate 211 facing away from the second heat-conducting plate 212. The heat conducting protective layer 213 may also be disposed on a surface (i.e., the lower surfaces as shown in FIG. 4 and FIG. 6) of the second heat-conducting plate 212 facing away from the first heat-conducting plate 211. The conducting protective layer may be disposed on either or both of the first heat-conducting plate and the second heat-conducting plate. As its name implies, the conducting protective layer 213 may not only conduct heat but also protect the first heat-conducting plate and the second heat-conducting plate on which the conducting protective layer is disposed from being damaged.

Figure 5:
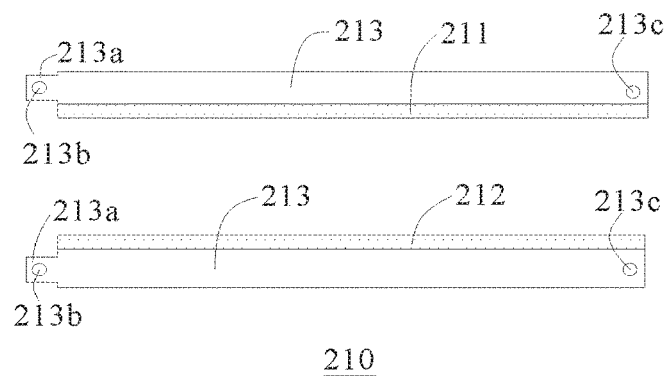
FIG. 5 is a schematic diagram of a fixed block without a thermoelectric conversion sub-module disposed therein.

As shown in FIG. 5, in the present disclosure, for example, each of the fixed blocks 210 may include the first heat-conducting plate 211, the heat-conducting protective layer 213 disposed on the first heat-conducting plate 211, the second heat-conducting plate 212, and the heat-conducting protective layer 213 disposed on the second heat-conducting plate 212.

As described above, two adjacent fixed blocks may hinged with each other, so as to form the fixed portion as a chain. As such, it is easier for the surface of the fixed portion to contact the wrist of the wearer, and then to absorb heats on the body of the wearer. In order to hinge the fixed blocks with each other, for example, in two adjacent ones of the fixed blocks, the heat-conducting protective layers disposed on the first heat-conducting plates are hinged with each other; and/or in two adjacent ones of the fixed blocks, the heat-conducting protective layers disposed on the second heat-conducting plates are hinged with each other In the implementation shown in FIG. 5, each of the heat-conducting protective layers 213 is provided with a structure for hinging. For example, an embossment for hinging 213a may be disposed on one end of the heat-conducting protective layers 213 (the left end as shown in FIG. 5), on which a first hinge hole 213b may be disposed; and a second hinge hole 213c may be disposed on the other end of the heat-conducting protective layers 213 (the right end as shown in FIG. 5). When being hinged, the first hinge hole 213b on the embossment for hinging 213a of the heat-conducting protective layer in one fixed block may be aligned with the second hinge hole on the heat-conducting protective layer in an adjacent fixed block; a pivotal axis may be disposed in the aligned first hinge hole and the second hinge hole; as a result, the two fixed blocks are hinged together.

When the wearable electronic device is worn by a wearer, the second heat-conducting plate 212 contacts a wrist of the wearer, which conducts the body temperature of the wearer to a side of the P-type semiconductor 311 and the N-type semiconductor 312 of the thermoelectric conversion unit 310a, while the first heat-conducting plate 211 is exposed to air, and conducts the environment temperature to the other side of the P-type semiconductor 311 and the N-type semiconductor 312 of the thermoelectric conversion unit 310a. Since a temperature difference exits between one side of the thermoelectric conversion unit 310a and the other side of the thermoelectric conversion unit 310a, the thermoelectric conversion unit 310a can generate electrical energy, and deliver the generated electrical energy to the accumulator 120 which will store the electrical energy for driving the display screen 110 to display.

In the present disclosure, both the P-type semiconductor and the N-type semiconductor are made of thermoelectric materials, for example, those thermoelectric materials work at temperatures ranging from 25° C. to 100° C. As an implementation of the present disclosure, the P-type semiconductor 311 may include P-doped $Bi_2Te_3$, and the N-type semiconductor 312 may include N-doped $Bi_2Te_3$.

For example, the P-type semiconductor 311 is doped with Sb, and the N-type semiconductor 312 is doped with Se.

In the present disclosure, both the first heat-conducting plate 211 and the second heat-conducting plate 212 may be made of materials having good heat conductivity and insulating characteristics. For example, the first heat-conducting plate 211 or the second heat-conducting plate 212 may be made of ceramic material. Alternatively, both the first heat-conducting plate 211 and the second heat-conducting plate 212 may be made of ceramic material. The ceramic material may be $Al_2O_3$ ceramic, for example.

As shown in FIG. 4 and FIG. 6, a plurality of the thermoelectric conversion units may be included in the same fixed block. As shown in FIG. 4 and FIG. 6, for convenience of fabrication, for example, the N-type semiconductor of one thermoelectric conversion unit 310a may be adjacent to the P-type semiconductor of another thermoelectric conversion unit 310a; and the second plate electrode of the one one thermoelectric conversion unit 310a and the second plate electrode of the another thermoelectric conversion unit 310a may be integrated together; therefore, the plurality of thermoelectric conversion units 310a on one fixed block may be connected in series.

For convenience of connection, for example, each of the thermoelectric conversion sub-modules may include a leading-out end and a leading-in end. The leading-out end may be connected with the second plate electrode of the P-type semiconductor on an end of the thermoelectric conversion module, and the leading-in end may be connected with the second plate electrode of the N-type semiconductor on the other end of the thermoelectric conversion module. A current may flow into the thermoelectric conversion sub-module at the leading-in end, and flows out at the leading-out end As described above, a thermoelectric conversion unit may include two second plate electrodes and one first plate electrode. As shown in FIG. 4, in the thermoelectric conversion unit 310a on the most left end of the thermoelectric conversion sub-module 310, a plate electrode disposed on the upper end of the P-type semiconductor is shared with the N-type semiconductor on the left side of the P-type semiconductor, while a plate electrode disposed on the lower end of the P-type semiconductor is a separate plate electrode. Therefore, the separate plate electrode is the second plate electrode of the thermoelectric conversion unit 310a on the most left end of the thermoelectric conversion sub-module 310. In a thermoelectric conversion unit, the second plate electrode is adjacent to the cold source. As can be seen in FIG. 4, the lower surface of the wearable electronic device is used to contact the body of a wearer. That is to say, the wearable electronic device as shown in FIG. 4 uses the external environment as the heat source and the body of the wearer as the cold source.

The present disclosure is not limited hereto. For example, in the implementation in FIG. 6, the fixed portions on the left side use the body of the wearer as the cold source and the external environment as the heat source, while the fixed portions on the right side use the body of the wearer as the heat source and the external environment as the cold source.

For example, arrangement modes of the thermoelectric conversion sub-modules in each of the fixed blocks may include following situations.

Situation I: in two adjacent fixed blocks in the fixed portion, a second plate electrode corresponding to the leading-out end of a thermoelectric conversion sub-module in one of the two adjacent fixed blocks is disposed on one of the first heat-conducting plate and the second heat-conducting plate which is used to contact the body of the wearer, and a second plate electrode corresponding to the leading-out end of a thermoelectric conversion sub-module in the other one of the two adjacent fixed blocks is disposed on one of the first heat-conducting plate and the second heat-conducting plate which is used to contact the external environment. By this implementation, thermoelectric conversion sub-modules using the external environment as the heat source and thermoelectric conversion sub-modules using the body of the wearer as the heat source may be arranged alternatively.

Situation II: in the fixed portion, all second plate electrodes corresponding to leading-out ends of the thermoelectric conversion sub-modules are disposed on one of the first heat-conducting plate and the second heat-conducting plate which is used to contact the body of the wearer. Correspondingly, all second plate electrodes corresponding to leading-in ends of the thermoelectric conversion sub-modules are disposed on one of the first heat-conducting plate and the second heat-conducting plate which is used to contact the body of the wearer. This situation is the situation shown in FIG. 4, in which all the thermoelectric conversion sub-modules use the body of the wearer as the cold source and use the external environment as the heat source.

Situation III: all second plate electrodes corresponding to leading-out ends of the thermoelectric conversion sub-modules are disposed on one of the first heat-conducting plate and the second heat-conducting plate which is used to contact the external environment. Correspondingly, all second plate electrodes corresponding to leading-in ends of the thermoelectric conversion sub-modules are also disposed on one of the first heat-conducting plate and the second heat-conducting plate which is used to contact the external environment. This is the situation, in which all the thermoelectric conversion sub-modules use the body of the wearer as the heat source and use the external environment as the cold source.

Situation IV: the fixed portion is divided into two parts. In one part of the fixed portion, a second plate electrode corresponding to a leading-in end of each of the thermoelectric conversion sub-modules is disposed on one of the first heat-conducting plate and the second heat-conducting plate which is used to contact the body of the wearer; correspondingly, a second plate electrode corresponding to a leading-out end of each of the thermoelectric conversion sub-modules is disposed on one of the first heat-conducting plate and the second heat-conducting plate which is used to contact the body of the wearer. In the other part of the fixed portion, a second plate electrode corresponding to a leading-in end of each of the thermoelectric conversion sub-modules is disposed on one of the first heat-conducting plate and the second heat-conducting plate which is used to contact the external environment; correspondingly, a second plate electrode corresponding to a leading-out end of each of the thermoelectric conversion sub-modules is disposed on one of the first heat-conducting plate and the second heat-conducting plate which is used to contact external environment. This is the situation, in which a part of the thermoelectric conversion sub-modules uses the body of the wearer as the heat source and uses the external environment as the cold source, and other parts of the thermoelectric conversion sub-modules use the external environment as the heat source and use the body of the wearer as the cold source. This situation is the situation shown in FIG. 5 and FIG. 6

Figure 7:
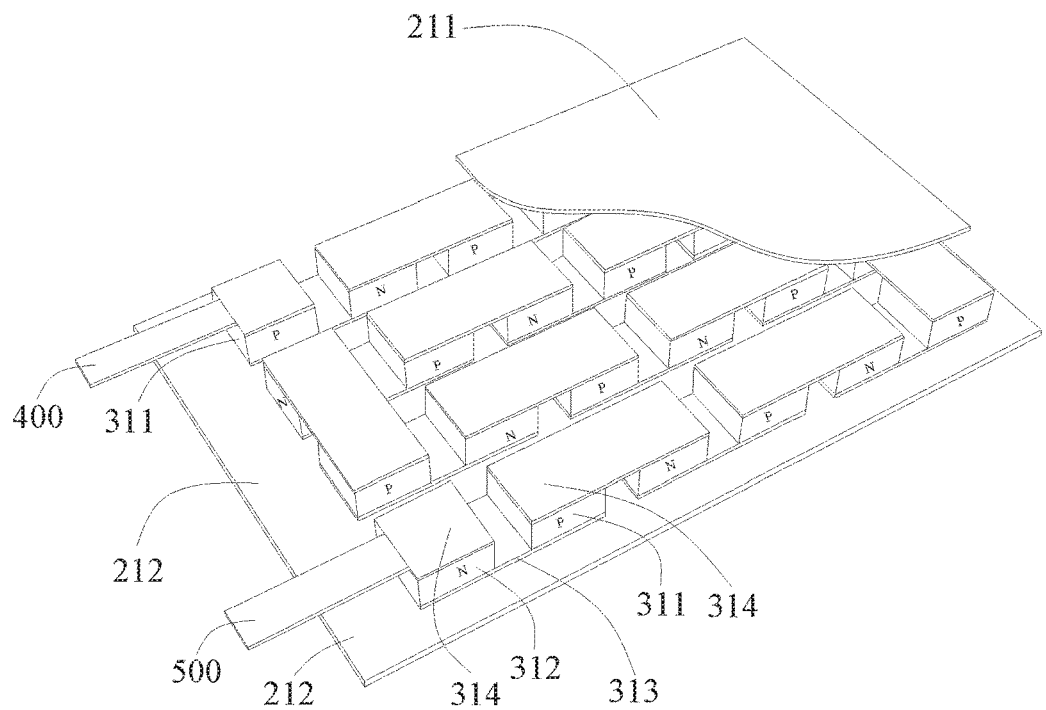
FIG. 7 is a schematic stereoscopic diagram of thermoelectric conversion modules in the wearable electronic device provided in the present disclosure.

For convenience of delivering the electrical energy generated by the thermoelectric conversion module into the accumulator, for example, as shown in FIG. 7, the output end of the thermoelectric conversion module includes a positive pole terminal 400 connected with the P-type semiconductor located at an end of the fixed portion which is connected with the display portion, and a negative pole terminal 500 connected with the N-type semiconductor located at the end of the fixed portion which is connected with the display portion. The positive pole terminal of the thermoelectric conversion module is connected with a negative pole of the accumulator and the negative pole terminal of the thermoelectric conversion module is connected with a positive pole of the accumulator.

It is understood that the above implementations are exemplary implementations provided for illustration of the principle of the present disclosure, but the present disclosure is not limited hereto. Those skilled in the art could make various variations and modifications to the present disclosure, without departure from the spirit and the scope of the present disclosure, which are intended to be covered by the scope of the present disclosure.

This application claims priority to Chinese Patent Application No. 201510249297.X, filed on May 15, 2015, and entitled "WEARABLE ELECTRONIC DEVICE", which is incorporated herein by reference in its entirety.

What is claimed is:

1. A wearable electronic device, comprising:
   a display portion;
   a fixed portion connected with the display portion, the fixed portion being configured to fix the wearable electronic device on the body of a wearer;
   wherein the display portion includes a display screen, and the fixed portion is provided with a thermoelectric conversion module electrically insulated from external environment; and the thermoelectric conversion module is configured to convert a temperature difference between a body temperature of the wearer and a temperature of the external environment into electrical energy used for operating the wearable electronic device; and
   wherein the thermoelectric conversion module comprises a first plurality of thermoelectric conversion sub-modules using the body of the wearer as a heat source and using the external environment in which the thermoelectric conversion sub-modules are located as a cold source, and a second plurality of thermoelectric conversion sub-modules using the external environment in which the thermoelectric conversion sub-modules are located as a heat source and using the body of the wearer as a cold source, the first plurality of the thermoelectric conversion sub-modules and the second plurality of thermoelectric conversion sub-modules being arranged alternately.

2. The wearable electronic device according to claim 1, wherein the display portion further includes an accumulator, an input end of the accumulator is connected with an output end of the thermoelectric conversion module, so as to store the electrical energy generated by the thermoelectric conversion module, and an output end of the accumulator is connected with a power input end of the display screen.

3. The wearable electronic device according to claim 1, wherein the first plurality of thermoelectric conversion sub-modules are connected with each other in series, and the second plurality of thermoelectric conversion sub-modules are connected with each other in series.

4. The wearable electronic device according to claim 1, wherein a surface of each of the second plurality of thermoelectric conversion sub-modules using the external environment as the heat source facing the external environment is provided with a layer of heat-absorption material; and/or
   a surface of each of the first plurality of thermoelectric conversion sub-modules using the body of the wearer as a heat source contacting the body of the wearer is provided with a layer of heat-absorption material.

5. The wearable electronic device according to claim 3, wherein the display portion and the fixed portion form a closed ring.

6. The wearable electronic device according to claim 5, wherein the fixed portion includes a plurality of fixed blocks, adjacent fixed blocks of the plurality of fixed blocks are hinged with each other, and each of the plurality of fixed blocks is provided with one of the thermoelectric conversion sub-modules.

7. The wearable electronic device according to claim 6, wherein each of the thermoelectric conversion sub-modules includes at least one thermoelectric conversion unit, the thermoelectric conversion unit includes a P-type semiconductor, an N-type semiconductor, a first plate electrode, and two second plate electrodes;
   wherein the first plate electrode is provided on a side of the thermoelectric conversion unit, both the P-type semiconductor and the N-type semiconductor are fixed on the first plate electrode, and one of the two second plate electrodes is provided on an end of the P-type semiconductor facing away from the first plate electrode and the other one of the two second plate electrodes is provided on an end of the N-type semiconductor facing away from the first plate electrode; and
   both the P-type semiconductor and the N-type semiconductor are made of thermoelectric materials, and the P-type semiconductor and the N-type semiconductor have different Seebeck coefficients.

8. The wearable electronic device according to claim 7, wherein each of the fixed blocks includes a first heat-conducting plate and a second heat-conducting plate, both the first heat-conducting plate and the second heat-conducting plate are insulated from each other; the first plate electrode is fixed on the first heat-conducting plate, and the second plate electrodes are fixed on the second heat-conducting plate.

9. The wearable electronic device according to claim 8, wherein both the first heat-conducting plate and the second heat-conducting plate are made of ceramic material.

10. The wearable electronic device according to claim 7, wherein the P-type semiconductor includes P-doped $Bi_2Te_3$, and the N-type semiconductor includes N-doped $Bi_2Te_3$.

11. The wearable electronic device according to claim 10, wherein the P-type semiconductor is doped with Sb and the N-type semiconductor is doped with Se.

12. The wearable electronic device according to claim 7, wherein a plurality of the thermoelectric conversion units are included on a same one of the plurality of fixed blocks, the N-type semiconductor of one of the thermoelectric conversion units is adjacent to the P-type semiconductor of another thermoelectric conversion unit adjacent to the one; and second plate electrodes of the two adjacent thermoelectric conversion units are integrated together.

13. The wearable electronic device according to claim 12, wherein each of the thermoelectric conversion sub-modules includes a leading-out end and a leading-in end; the leading-out end is connected with the second plate electrode of the P-type semiconductor on an end of the thermoelectric conversion module, and the leading-in end is connected with the second plate electrode of the N-type semiconductor on the other end of the thermoelectric conversion module; and a current flows into the thermoelectric conversion sub-module at the leading-in end, and flows out at the leading-out end.

14. The wearable electronic device according to claim 13, wherein in two adjacent fixed blocks in the fixed portion, a second plate electrode corresponding to the leading-out end of a thermoelectric conversion sub-module in one of the two adjacent fixed blocks is provided on one of the first heat-conducting plate and the second heat-conducting plate which is configured to contact the body of the wearer, and a second plate electrode corresponding to the leading-in end of a thermoelectric conversion sub-module in the other one of the two adjacent fixed blocks is provided on one of the first heat-conducting plate and the second heat-conducting plate which is configured to contact the external environment; or all second plate electrodes corresponding to leading-out ends of the thermoelectric conversion sub-modules are provided on one of the first heat-conducting plate and the second heat-conducting plate which is configured to contact the body of the wearer; or all second plate electrodes corresponding to leading-out ends of the thermoelectric conversion sub-modules are provided on one of the first heat-conducting plate and the second heat-conducting plate which is configured to contact the external environment; or the fixed portion is divided into two parts: in one part of the fixed portion, a second plate electrode corresponding to a leading-in end of each of the thermoelectric conversion sub-modules is provided on one of the first heat-conducting plate and the second heat-conducting plate which is configured to contact the body of the wearer, while in the other part of the fixed portion, a second plate electrode corresponding to a leading-in end of each of the thermoelectric conversion sub-modules is provided on one of the first heat-conducting plate and the second heat-conducting plate which is used to contact the external environment.

15. The wearable electronic device according to claim 7, wherein the output end of the thermoelectric conversion module includes a positive pole terminal connected with the P-type semiconductor located at an end of the fixed portion which is connected with the display portion, and a negative pole terminal connected with the N-type semiconductor located at the end of the fixed portion which is connected with the display portion.

16. The wearable electronic device according to claim 7, wherein each of the fixed blocks includes a heat-conducting protective layer, the heat conducting protective layer is provided on a surface of the first heat-conducting plate facing away from the second heat-conducting plate, and/or the heat conducting protective layer is provided on a surface of the second heat-conducting plate facing away from the first heat-conducting plate.

17. The wearable electronic device according to claim 16, wherein both the first heat-conducting plate and the second heat-conducting plate are provided with the heat-conducting protective layer; in two adjacent ones of the fixed blocks, the heat-conducting protective layers provided on the first heat-conducting plates are hinged with each other, and/or in two adjacent ones of the fixed blocks, the heat-conducting protective layers provided on the second heat-conducting plates are hinged with each other.

18. The wearable electronic device according to claim 2, wherein the first plurality of thermoelectric conversion sub-modules are connected with each other in series, and the second plurality of thermoelectric conversion sub-modules are connected with each other in series.

* * * * *